(12) United States Patent
Mansfield et al.

(10) Patent No.: US 7,765,021 B2
(45) Date of Patent: Jul. 27, 2010

(54) METHOD TO CHECK MODEL ACCURACY DURING WAFER PATTERNING SIMULATION

(75) Inventors: Scott M. Mansfield, Hopewell Junction, NY (US); Lars W. Liebmann, Poughquag, NY (US); Mohamed Talbi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 205 days.

(21) Appl. No.: 12/015,077

(22) Filed: Jan. 16, 2008

(65) Prior Publication Data

US 2009/0182448 A1    Jul. 16, 2009

(51) Int. Cl.
*G06F 19/00*    (2006.01)
*G06F 17/50*    (2006.01)
*G06K 9/00*    (2006.01)

(52) U.S. Cl. ............... 700/108; 716/2; 716/4; 716/12; 716/19; 700/110; 703/14; 382/169

(58) Field of Classification Search ............ 700/108, 700/110; 382/169; 716/2, 4, 12, 19; 703/14
See application file for complete search history.

(56) References Cited

U.S. PATENT DOCUMENTS

| | | | |
|---|---|---|---|
| 4,924,323 | A * | 5/1990 | Numakura et al. .......... 382/169 |
| 5,657,235 | A | 8/1997 | Liebmann et al. |
| 6,415,421 | B2 | 7/2002 | Anderson et al. |
| 6,470,489 | B1 | 10/2002 | Chang et al. |
| 6,602,728 | B1 * | 8/2003 | Liebmann et al. ............. 438/16 |
| 6,622,547 | B1 | 9/2003 | Phan et al. |
| 6,634,018 | B2 | 10/2003 | Randall et al. |
| 6,952,818 | B2 | 10/2005 | Ikeuchi |
| 6,988,259 | B2 | 1/2006 | Pierrat et al. |

(Continued)

FOREIGN PATENT DOCUMENTS

JP    2002-278041    9/2002

(Continued)

OTHER PUBLICATIONS

Wong et al., "Lithographic Effects of Mask Critical Dimension Error" IBM Microelectronics, 1998, 11 pages.*

(Continued)

*Primary Examiner*—Albert DeCady
*Assistant Examiner*—Thomas H Stevens
(74) *Attorney, Agent, or Firm*—Wenjie Li

(57) ABSTRACT

A method, and computer program product and system for performing the method, is provided for designing a mask used in the manufacture of semiconductor integrated circuits, in which a model of the lithographic process is used during the mask design process. More particularly, the on-wafer process model is a function of optical image parameters that are calibrated using measurements from a test pattern. An uncertainty metric for the predicted response simulated by the on-wafer process model is computed for a given evaluation point of interest as a function of a distance metric between the collective optical image parameters simulated at the given evaluation point and the collective optical image parameters at the calibration data points. The uncertainty metric preferably is also a function of the sensitivity of the on-wafer process model response to changes in the optical image parameters.

20 Claims, 9 Drawing Sheets

U.S. PATENT DOCUMENTS

| | | | |
|---|---|---|---|
| 6,996,797 B1 | 2/2006 | Liebmann et al. | |
| 7,638,244 B2 * | 12/2009 | Kanai | 430/5 |
| 2006/0005154 A1 | 1/2006 | Cobb et al. | |

FOREIGN PATENT DOCUMENTS

| | | |
|---|---|---|
| JP | 2004-029193 | 1/2004 |
| JP | 2004-354919 | 12/2004 |

OTHER PUBLICATIONS

Lavin et al., CAD Computation for Manufacturability: Can We Save VLSI Technology from Itself?. 2002, IBM Research Division, p. 424-431.*

Talbi et al., "Model-based Calculation of Weighting in OPC Model Calibration" 2006, p. 1-7.*

* cited by examiner

METHOD TO CHECK MODEL ACCURACY DURING WAFER PATTERNING SIMULATION

TECHNICAL FIELD

The present invention relates in general to the design and manufacture of integrated circuits, and more particularly, to design methodologies that include simulation of lithographic processes.

BACKGROUND OF THE INVENTION

The manufacturing of integrated circuits involves the design and use of lithographic processes to transfer patterns representing integrated circuit layouts to a semiconductor substrate or wafer. The lithographic pattern transfer process includes the use of a photomask to transfer patterns on the photomask to a film stack on a semiconductor wafer. The pattern transfer process from a photomask to a film stack on a semiconductor wafer is routinely simulated during design and manufacture of the photomask using a variety of process models. One important application of this simulation is Optical Proximity Correction (OPC), where nonlinearities in the patterning process are corrected for by predistorting the mask in a manner so that the final pattern looks very similar to the desired target pattern. The process models used for this type of simulation are often divided into at least two components. The first component, the "optical model," describing the optics of the lithography tool and typically simulates an optical image of the mask at some plane inside the photoresist material. The second component, the "photoresist model," describes how the photoresist material responds to that optical image (exposure) and the subsequent processing of the resist (development) that is done to create a pattern on the wafer. So, the combination of an optical and photoresist model can be used to simulate how a photomask pattern will be transferred to a pattern on a wafer. Other pattern transferring processes, such as etch, can also be modeled in a similar fashion, for example, as a polynomial or other empirically calibrated function of image parameters, as known in the art.

Photoresist models are typically approximations to the true physical behavior and are used to describe the simulated location of a patterned edge. These approximations are often based on a model form made up of a polynomial with terms based on parameters of the optical image that exposes the resist. For example, this polynomial may have terms containing the maximum image intensity or the slope of the image intensity. In addition to linear terms in these parameters, there can also be higher order terms including quadratic terms in any of the image parameters and cross-terms between image parameters. In these types of models, each term in the polynomial has a corresponding multiplicative coefficient that is typically calibrated to experimental data using a least-squares fitting algorithm, with the result often being considered the "best-fit polynomial." The best fit model is one which has coefficients which, given particular values of the independent variables, will most closely fit the emprically measured data according to some metric of goodness, such as a root mean square (RMS) error, even though the model may not exactly reproduce the calibration data. An example of such a polynomial is given in equation (1). Here, the photoresist response is given by R, the multiplicative coefficients are specified as $a_n$, and the terms I_max and slope represent the maximum image intensity and slope of the image intensity, respectively. Depending on the type of modeling being done, the photoresist response function R may represent different things. In some cases, it represents a threshold value that is applied to the optical image to determine where printed edges occur and, in other cases, it represents a latent image that is exposed in the photoresist, where printed edges occur when this image crosses a predetermined threshold. It is evident that linear terms ($a_1$*I_max), quadratic terms ($a_3$*slope$^2$) and cross-terms ($a_4$*I_max*slope) are used:

$$R = a_o + a_1 * I\_max + a_2 * slope + a_3 * slope^2 + a_4 * I\_max * slope \qquad (1)$$

Best-fit polynomial models have been shown to very accurately represent the data that was used in the calibration of the coefficients and, when calibrated properly, to remain very accurate for data points interpolated over small distances between calibration points. FIG. 1 illustrates a plot of edge placement error (EPE) of simulated images versus measured edge placements for verification test patterns that were not included in the model calibration. FIG. 1 shows that the edge placements for patterns specified by the circle 101 are very accurately modeled by the model used in the simulations since their EPE values are close to zero. Due to the non-physical nature of the polynomial representation, however, these models do not typically have very good accuracy for data points that fall outside of the calibration set. These points require the model to extrapolate to image parameters that are beyond the values used in the calibration set. Accuracy may also suffer if the image parameters fall in a region where the model is interpolating between calibration points, but the distance from the nearest calibration point to the point of interest is large. Poor accuracy is seen for patterns 102 in FIG. 1 where the EPE values are relatively large negative values.

FIG. 2 illustrates three image parameter values, Imin, Imax and curvature, computed at selected evaluation points of a calibration test structure (hereinafter, "calibration points"). The optical parameters obtained at the selected calibration points, 203, are plotted. In addition, image parameters 202 are plotted for evaluation points on verification patterns that were determined to have poor accuracy. The plot shows that the verification image parameters 202, fell within a large gap in the calibration data 203. However, the image parameters for the verification pattern 202 still fell within the bounds defined by the largest and smallest calibrated values for each image parameter. These bounds are shown as rectangular projections, 201, onto each 2-dimensional plane in this 3-dimensional plot.

Controls must be put in place to ensure that a resist (or other polynomial fitted) model remains accurate under any arbitrary imaging conditions. This is done typically during calibration of the resist model 316 as illustrated in FIG. 3. A set of calibration patterns 302 are used to obtain measured image data (calibration data 301). The calibration patterns 302 are provided as input into the optical model 303 to obtain simulated images 304. The simulated images 304 are used to obtain the polynomial coefficients, and thereby calibrate the (Block 305) photoresist model 307, by fitting the polynomial to the measured image data 301 from calibration patterns 302. The simulated images 304 are also used to determine extreme values for each image parameter (306) for all of the calibration data points and these extreme calibration data points are stored with the stored model 318 as one dimensional (1D) model bounds 308. These one-dimensional model bounds 308 are equivalent to those shown in FIG. 2 (201) and are the only values that are stored to provide information on the expected accuracy of the photoresist model 307 for any arbitrary image.

These bounds 308 are normally used in one of two ways when modeling a lithographic process for a pattern layout 309 to simulate a photoresist image 315. The first is shown in block 317, where the optical model 310 is used to obtain the simulated image 311 transmitted from the optical system. The simulated image parameters 311 can be checked against the model bounds 308 and, if they are outside of the model bounds, the image parameters 311 used in the resist model 307 that would exceed the range of calibration data can be limited (i.e. reset) (Block 312) to be equal to exactly the model bound value 308 (Block 313). In this way, the image parameters 311 are never allowed to go out of bounds, so the resist model 307 should never be predicting the response of the resist (as computed in Block 314) in an optical regime beyond which the resist model 307 was calibrated. This is only the case, however, if every single term in the polynomial, including quadratic and cross-terms, has set bounds that are enforced. Often, a simplifying assumption is made that only the linear values of each image parameter need to be bounded. When limiting the image parameters 311 to the bound values 308, the assumption is made that the resist model 307 will be more accurate by using the "wrong" artificially set image parameters (i.e. the model bound values 308) than it will by using the "right" model predicted image parameters (i.e. the actually simulated image parameters 311 computed by the optical model) when the simulated image parameters 311 fall outside the model bounds 308. This approximation leads to significant uncertainty in the modeled response of the resist for regions when the image parameters 311 are limited to the model bounds 308.

The second way the bounds 308 are used is illustrated in Block 417 of FIG. 4, which is to just highlight regions where the image parameters 311 fall outside the model bounds 308. For example, in FIG. 4, the design layout 309 is used to obtain the simulated image 311 from the optical model 310, as in FIG. 3. However, in this example, the photoresist model 307 is used to compute the resist response 415 to the simulated images 311, but if the images are outside the bounds 308 of the calibrated data (Block 420), then these resist responses corresponding to the out of bounds simulated image parameters are tagged (Block 421). In this way, these regions of the resist image 415 can be shown to have questionable model accuracy. Again in this case, only the one-dimensional model bounds 308 have been used to highlight regions of questionable model accuracy. In this case, the resist model 307 is allowed to use the out-of-bounds image parameters as computed by the optical model (Block 310) and return a modeled resist response 414. However, the modeled resist image 415 may have portions marked as having large uncertainty. Such tags merely highlight regions that are "uncertain" without providing a quantitative measure of the uncertainty. In addition, the cutoff between "certain" and "uncertain" is based solely on the one-dimensional model bounds 308.

In view of the foregoing, it would be desirable to provide a method to quantify the uncertainty of resist or other polynomial models of image parameters.

SUMMARY OF THE INVENTION

A method, and computer program product and system for performing the method, is provided for designing a mask used in the manufacture of semiconductor integrated circuits, in which a model of the lithographic process is used during the mask design process. More particularly, the on-wafer process model is a function of optical image parameters that are calibrated using measurements from a test pattern. An uncertainty metric for the predicted response simulated by the on-wafer process model is computed for a given evaluation point of interest as a function of a distance metric between the collective optical image parameters simulated at the given evaluation point and the collective optical image parameters at the calibration data points. The uncertainty metric preferably is also a function of the sensitivity of the on-wafer process model response to changes in the optical image parameters. The use of the uncertainty metric enables more reliable modifications of the design process.

In a first aspect according to the invention, a method is provided for optimizing a lithographic process for manufacturing semiconductor integrated circuits, including using an empirically calibrated process model. The method includes providing a calibration test structure; computing an optical image for the calibration test structure using an optical model; forming a printed image of the calibration test structure on a wafer using the lithographic process; and determining measurement data from the printed calibration test structure and optical image parameters from the optical image at selected calibration points of the calibration test structure. Then a process model comprising a function of optical image parameters for determining a predicted on-wafer response value is calibrated so that the predicted on-wafer response value predicts the measurement data within a predetermined metric. Then an uncertainty metric associated with the predicted on-wafer response value is provided for a selected set of values of the optical image parameters, the uncertainty metric comprising a function of a distance metric between the selected set of optical image parameters and the optical image parameters at the selected calibration points. The process model is applied to a non-calibration mask pattern to obtain a predicted non-calibration on-wafer response and a determination is made as to whether the uncertainty metric associated with the predicted non-calibration on-wafer response violates a predetermined criterion.

If said predetermined criterion is violated, then the method may further comprise modifying said non-calibration mask pattern in accordance with said predetermined criterion determining whether said uncertainty metric associated with said predicted non-calibration on-wafer response violates a predetermined criterion.

According to another aspect of the invention, the distance metric comprises a Euclidean distance between said optical image parameters obtain from said optical model at an evaluation point of interest and said optical image parameters from said optical image at said selected calibration points.

According to yet another aspect of the invention, the uncertainty metric further comprises a function of a sensitivity metric that represents the rate of change of said on-wafer response as a function of a change in said optical image parameters along said distance metric.

According to a further aspect of the invention, the uncertainty metric comprises determining a root-mean-square of said distance metric between said selected set of optical image parameters evaluated at an evaluation point of interest and said optical image parameters at said selected calibration points.

The method according to the invention may be implemented in a computer system or computer program product.

According to another aspect of the invention, a set of uncertainty values of said uncertainty metric is determined over a range of selected values of said optical image parameters, and storing said set of uncertainty values in a look-up table.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

According to one embodiment of the present invention, a method is provided for designing a mask used in the manufacture of semiconductor integrated circuits, in which a model of the lithographic process is used during the mask design process. More particularly, one embodiment according to the invention includes providing a method for modeling the photoresist response to a lithographic process that provides a quantitative measure of uncertainty of the resist model predicted response. This invention relates to an improved methodology for determining lithographic process model accuracy for the simulation of the resist or other on-wafer process response to an arbitrary mask design that has a set of image parameters associated with it. Although the example of a resist model is used as an example in describing embodiments of the invention, the invention is not so limited, and is applicable to any empirically calibrated model of a lithographic process.

Figure 1:
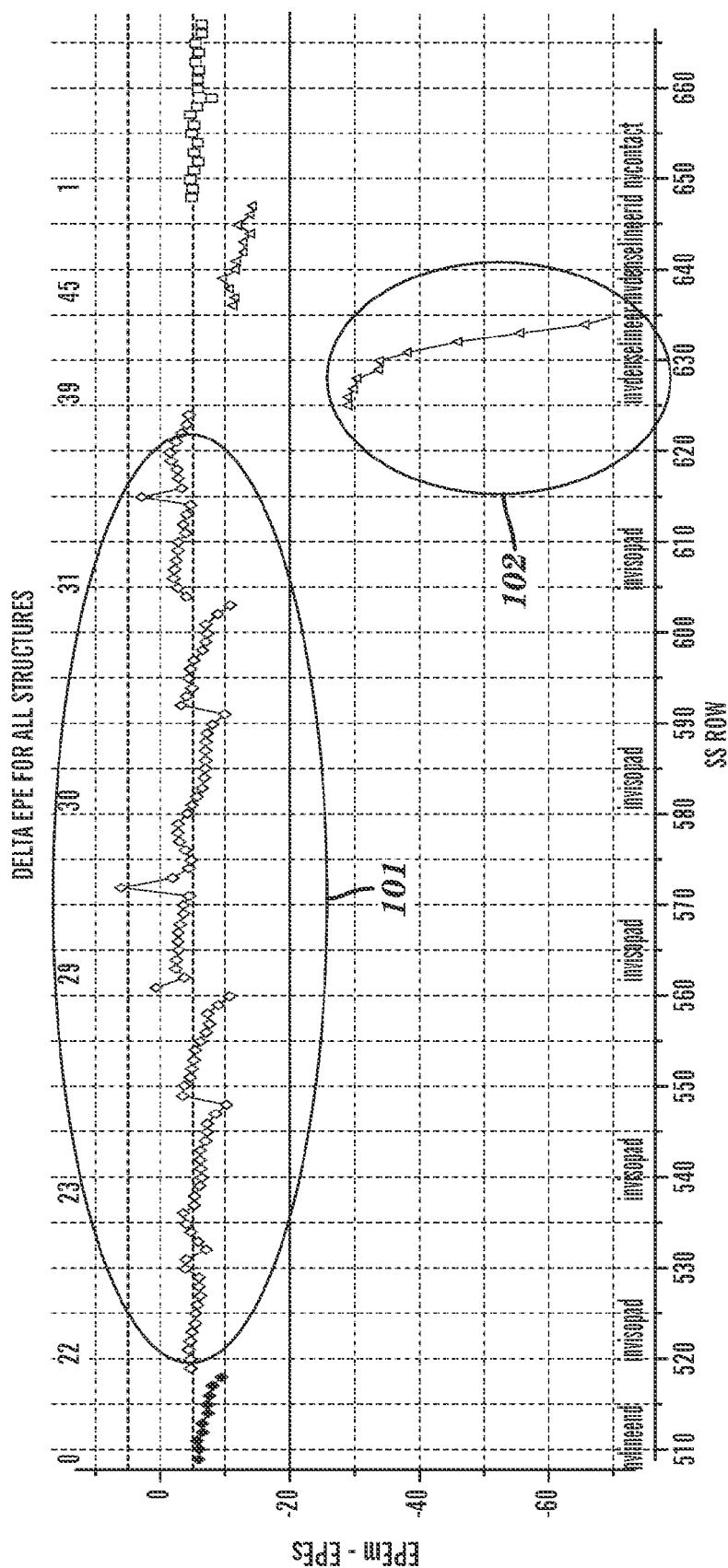
FIG. 1 illustrates a plot of edge placement error (EPE) of simulated images versus measured edge placements.
Figure 2:
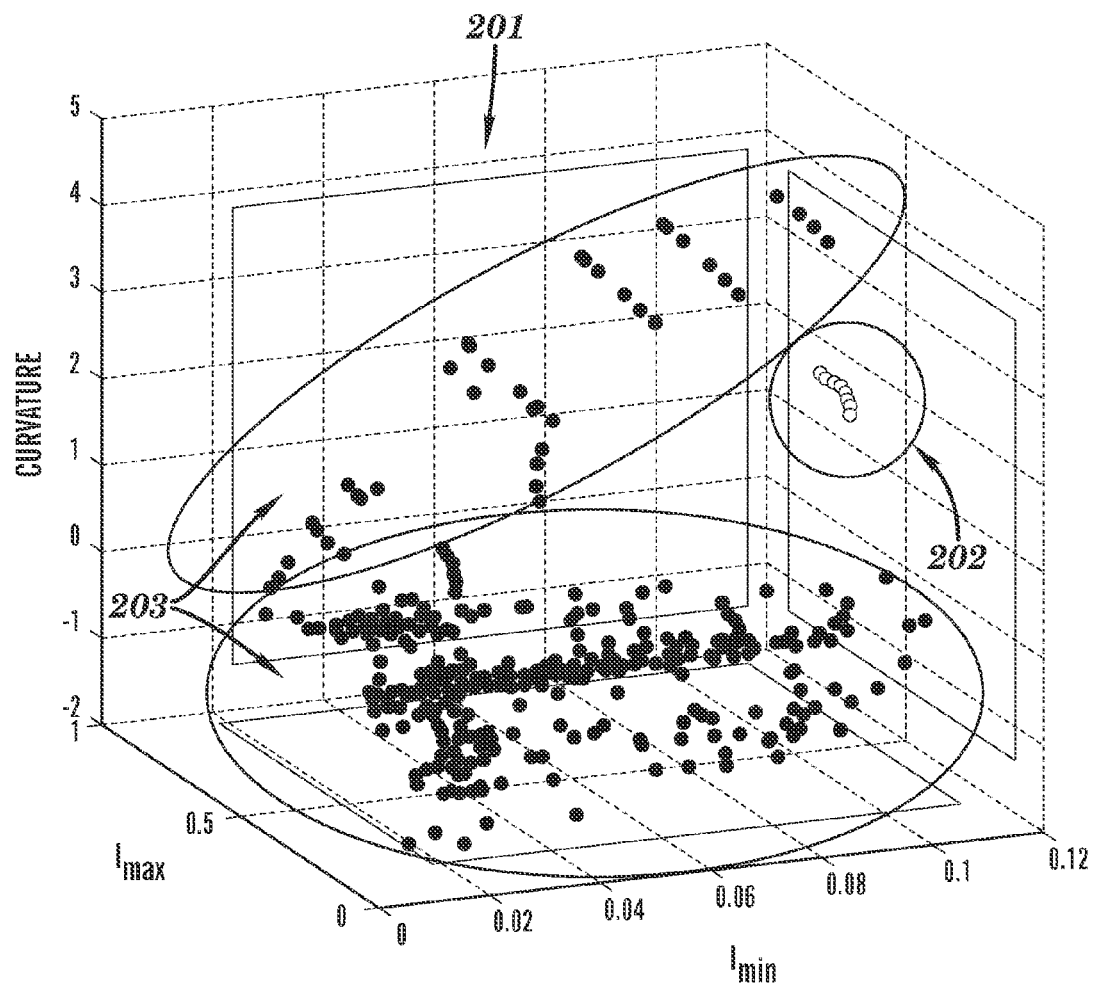
FIG. 2 illustrates a plot of three image parameter values, Imin, Imax and curvature, computed at selected evaluation points of a calibration test structure.
Figure 3:
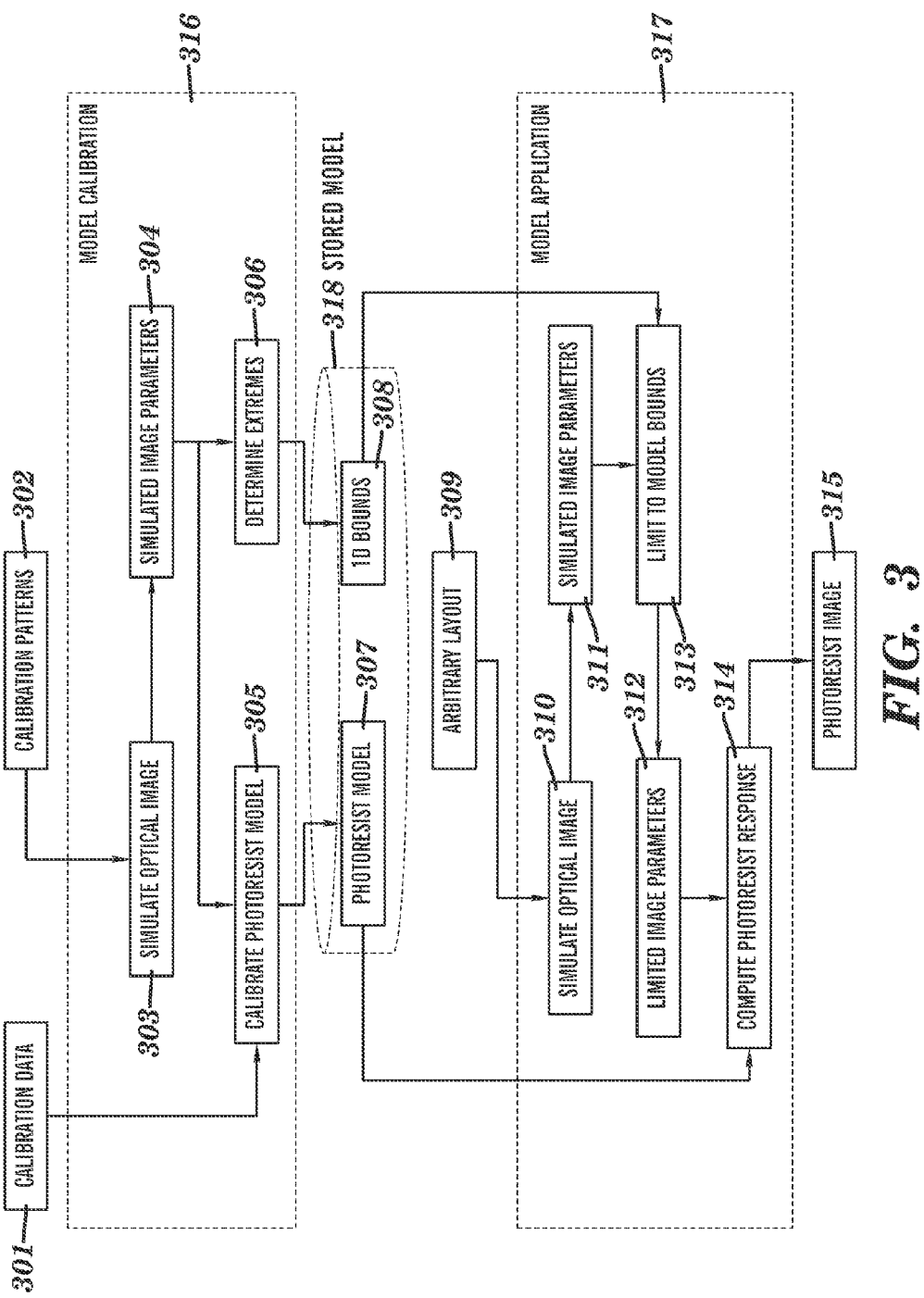
FIG. 3 illustrates a prior art method of performing mask design.
Figure 4:
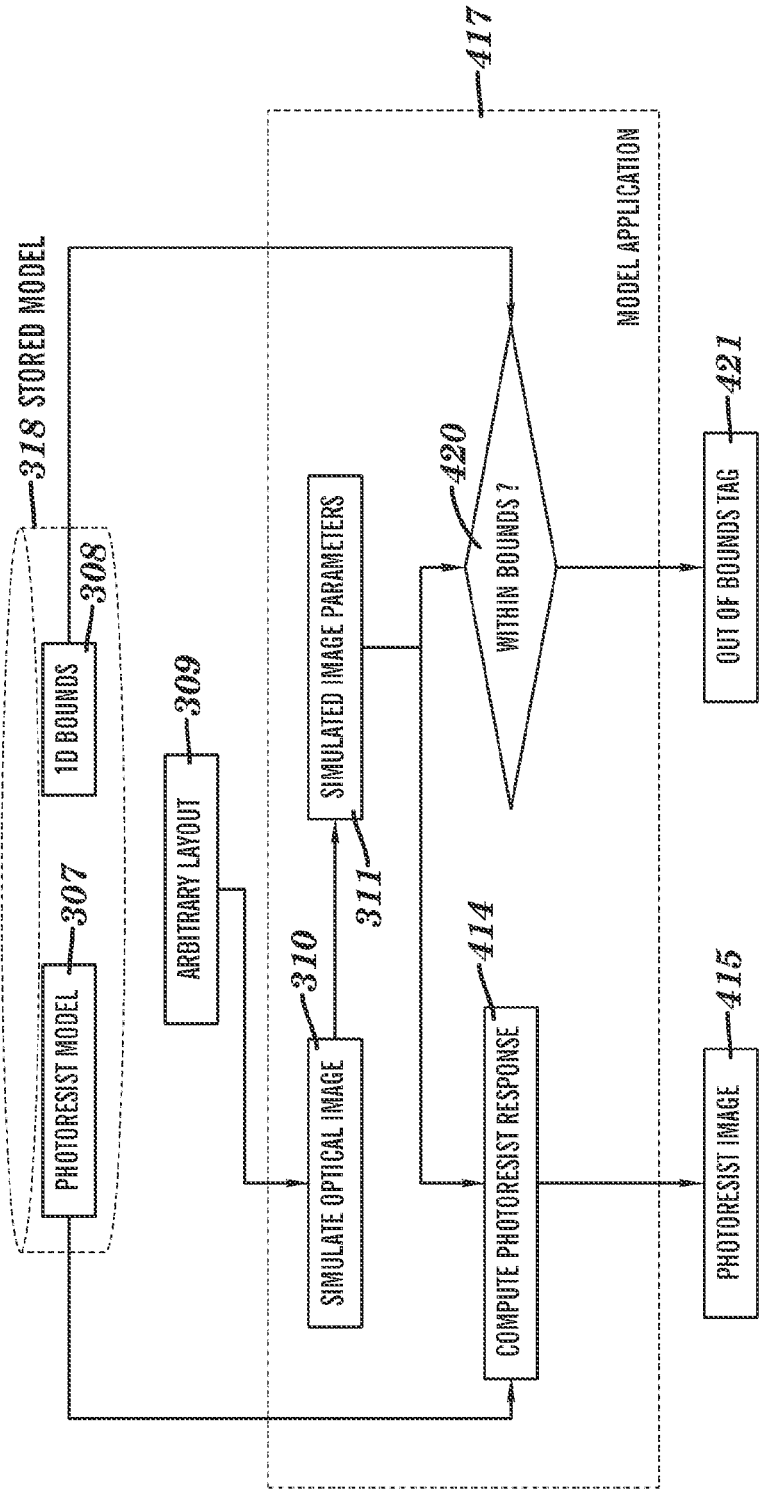
FIG. 4 illustrates a prior art method of performing mask design.
Figure 5:
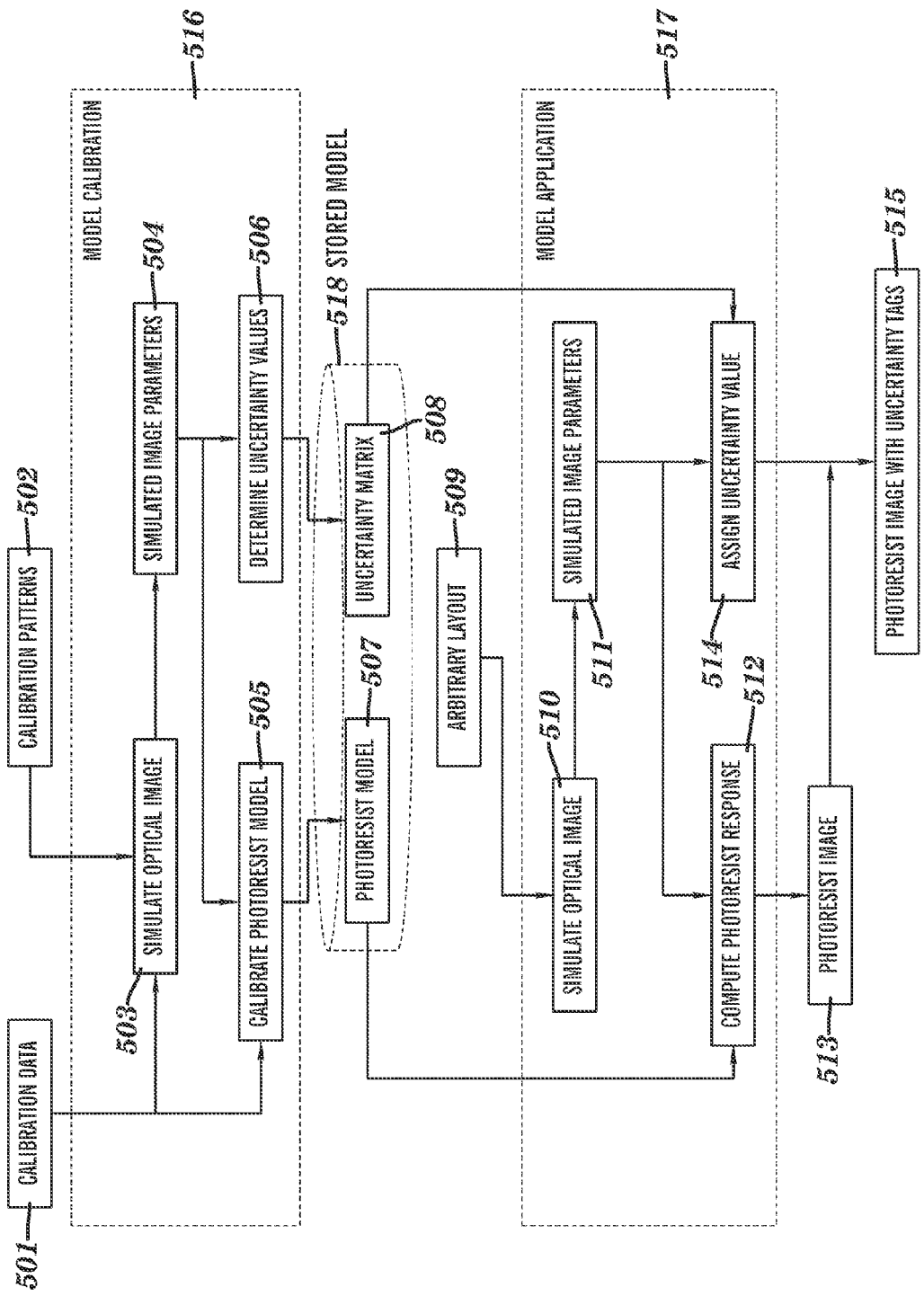
FIG. 5 illustrates an embodiment of performing mask design in accordance with the invention.

Referring to FIG. 5, one embodiment of the present invention is illustrated. During the model calibration (516), a set of calibration patterns (502) are simulated using an optical model (503) and the simulated image parameters (504) are found. These image parameters 504, along with the measured calibration data (501) are used to calibrate (505) the empirical photoresist model (507). The steps are all accomplished using standard practices known in the industry. However, in this embodiment, the calibration data (501) and the simulated image parameters (504) are also used to create (Block 506) an uncertainty value for the model response for each of a selected set of values of the independent model parameters. The uncertainty value for a given set of image parameter values, for example, those computed at a given point of interest, is derived from a metric of distance between the image parameters at the point of interest and the calibration points, as further discussed below. The model response uncertainty values may be stored in an Uncertainty Matrix (508), UM or lookup table. The uncertainty value may also incorporate model accuracy information that is calculated during the photoresist model calibration step (505), for example, by expressing the uncertainty value as a function of the collective uncertainty values associated with each of the calibration points. Both the photoresist model (507) and the UM (508) are stored in one or more files that are considered the stored model (518).

In the current state of the art, the bounds on image parameters (308) that are stored with the model only indicate the range of image parameters that existed in the calibration data and can only provide binary information on whether or not a simulated image parameter falls within the bounds of the calibrated data. However, limiting the values of the model independent values does not provide a reliable estimate of the uncertainty in the predicted response of the on-wafer process model. However, in accordance with the invention, given a model R that is a function of M independent image parameters, for a set of image parameter values over an expected range of the independent image parameter values, a model uncertainty value is provided for each set of image parameter values. Typical optical image parameters include, but are not limited to, maximum intensity $I_{max}$, minimum intensity $I_{min}$, image slope (slope), image curvature, and one or more integrated intensity, in which the image intensity is integrated over one or more distance ranges.

For example, consider the case for an on-wafer process model R that is a function of two (i.e. M=2) independent variables, specifically, image parameters Imax and slope. The expected range of Imax may range from Imax1 to ImaxJ, and slope may range from slope1 to slopeK. For a given set of values of Imax(j) and slope(k), where Imax1≦Imax(j)≦ImaxJ and slope1≦slope(k)≦slopeK, then a value R(j,k) may be computed as:

$$R(j, k) = a_o + a_1 I_{max}(j) + a_2 \text{slope}(k) + a_3 \text{slope}(j)^2 + a_4 I_{max}(j) \text{slope}(k) \quad (1a)$$

In accordance with the invention, a collective uncertainty value UC(j,k) associated with R(j,k) is computed based on a metric of distance of the values Imax(j) and slope(k) from the measured calibration data points. The uncertainty value UC(j, k) provides a statistical estimate of the amount of error in the model's predicted behavior R(j,k) collectively for all of the independent image parameter values at an evaluation point i=(j,k), without artificially limiting the image parameter values used to compute the resist response R to the bounds of the calibration data. Preferably, values of UC(j,k) are computed and stored for a range of permutations of the independent parameters, e.g., Imax(j) and slope(k), that incrementally spans the range of the parameters, e.g. if J=3, then Imax(j) may have values Imax(1), Imax(2), Imax(J) in increments of $\Delta I_{max}$, and if K=2, then slope(k) may have values slope(1), slope(K) in increments of Δslope. Thus, in this example, six (6) uncertainty values UC(j,k) are preferably computed and stored in a lookup table or uncertainty matrix (UM) containing six values of R(j,k), where i=(j,k) where j=1, 2, 3 and k=1, 2. In a preferred embodiment, UC(j,k) represents an uncertainty value for all values of R where Imax ranges from $I_{max}(j) - \Delta I_{max}$ to $I_{max}(j) + \Delta I_{max}$ and slope ranges from slope(k)-Δslope to slope(k)+Δslope.

In one embodiment according to the invention illustrated in Block 517 of FIG. 5, an arbitrary layout 509 can be simulated optically 510 and the optical image parameters 511 computed. The photoresist response is then computed 512 to create the photoresist image 513. At the same time, the simulated image parameters 511 are used with the UM 508 to assign uncertainty values 514 to simulated edges. The photoresist image 513 can then be tagged with uncertainty values 515, which can then be used in decision making.

Figure 6:
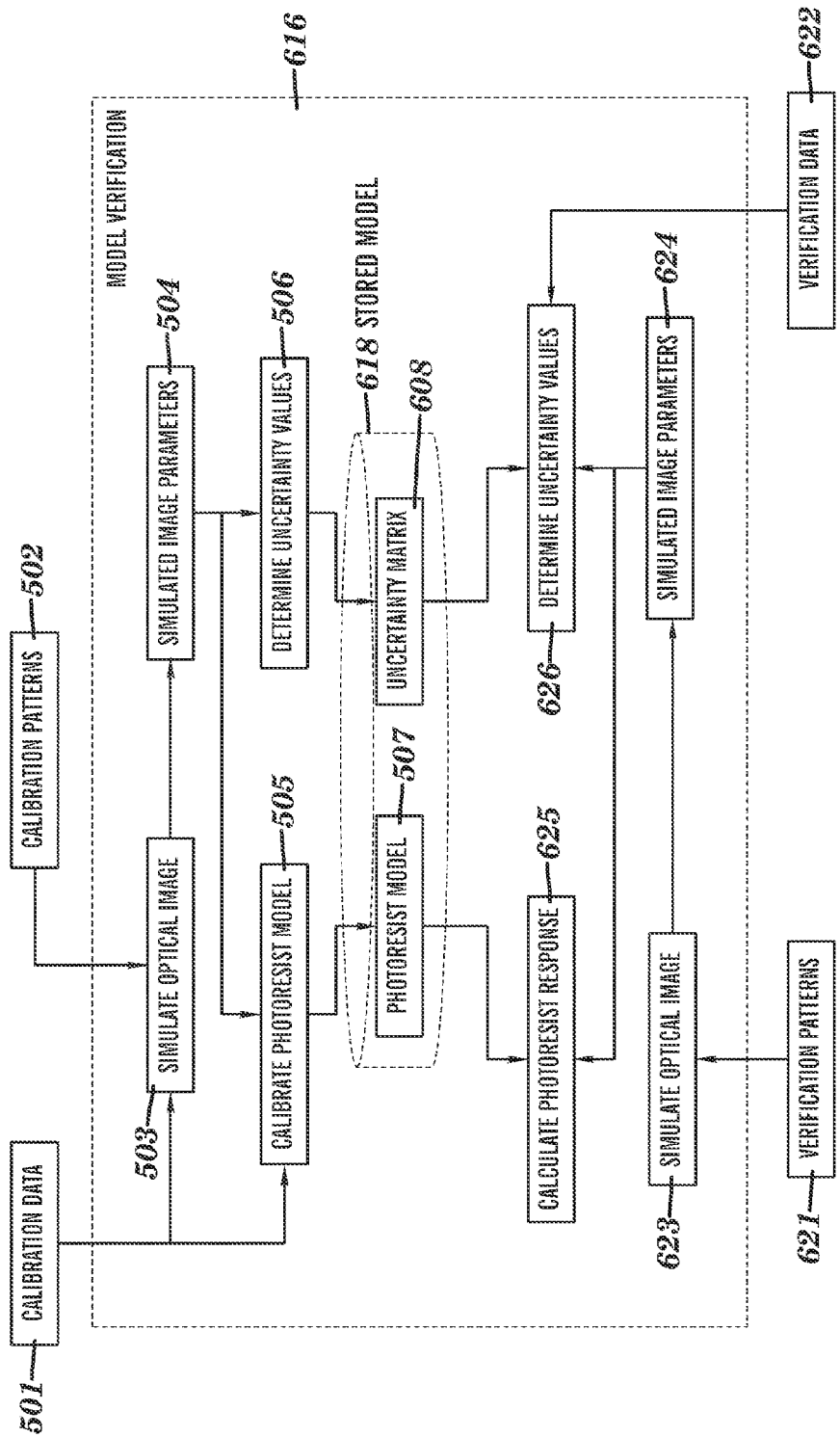
FIG. 6 illustrates another embodiment of performing mask design in accordance with the invention.

Additional measurement data that is just used to verify the model performance, as opposed to the initial calibration of the on-wafer process model 507, can also be used to compute the uncertainty values 514. For example, FIG. 6 illustrates an embodiment of the invention for performing model verification (Block 616) in which a set of verification test patterns 621 are used for the purpose of verifying whether the calibrated resist model 507 adequately predicts the behavior of a set of test patterns that were not included in the model calibration test patterns 502. In this embodiment, the simulation and measurement data 622 for these verification patterns 621 may also be used as input to the UM 608. The photoresist model (507) and the UM (608) may be stored in one or more files that are considered the stored model (618). The verification test patterns (621) are first simulated with the optical model to create simulated optical images (623) and the image parameters (624) are extracted from the optical images 623. The simulated photoresist response (625) is then computed and the results compared to the measured values (622) obtained by printing the test patterns 621 on the wafer using the lithographic process being represented by the model 507. The differences between the simulated response 625 and measured values 622 are used to create additional uncertainty values (626) that can be added to the UM (608).

To create the lookup table or UM, a set of model uncertainty values for sets of image parameters must first be determined. For a given set of image parameters $\vec{p}(i)$, where $\vec{p}$ is the vector of all independent variables in the model and i represents a particular point of interest at which the value of R(i) is computed.

To compute the uncertainty coefficients (UC) that populate the UM, first some notation needs to be introduced. The vector $\vec{p}$ represents the set of all the independent variables, e.g. optical image parameters, used in the process model function, as expressed in Equation 2:

$$\vec{p} = p_1 \hat{a}_1 + p_2 \hat{a}_2 + \ldots + p_M \hat{a}_M \qquad (2)$$

where the unit directional vectors $\hat{a}_j$ represent orthogonal basis vectors in the M-dimensional parameter space of the M independent parameters used in the process model. The coefficients $p_j$ are the values of each of the corresponding image parameters at an image point of interest. For example, the resist response R given in Equation 1 is a function of two image parameters, slope and I_max. In this case, M=2, $p_1$=I_max and $p_2$=slope.

One embodiment for the uncertainty coefficient, $UC(\vec{p}(i))$, of the process model response $R|_i$ for a set of M image parameters, $\vec{p}(i)$ evaluated at a point i of interest, is given by an RMS error as in Equation 3:

$$UC(\vec{p}(i)) = \frac{\sqrt{\sum_{n=1}^{N} w_n * ((e_{2*n-1} - \bar{r}_i)^2 + (e_{2*n} - \bar{r}_i)^2)}}{\sqrt{\sum_{n=1}^{N} 2 * w_n}} \qquad (3)$$

where N is the total number of empirical points in the data set used to create the Uncertainty Matrix (which includes at least calibration data 501 and may also include verification data 622), $e_{2*n-1}$ and $e_{2*n}$ are modified expected resist response values (described below) calculated for each data point, $\bar{r}_i$ is a weighted average expected resist response at the image point of interest i, n is an index for each of the N empirical data points, and $w_n$ is weight value for each empirical data point, as defined further below.

In a preferred embodiment according to the invention, a weighted average resist response, $\bar{r}_i$, at the image parameters at the point of interest i, $\vec{p}(i)$, is computed from the following:

$$\bar{r}_i = \frac{\sum_{n=1}^{N} w_n(i) * r_n(i)}{\sum_{n=1}^{N} w_n(i)} \qquad (4)$$

where $r_n(i)$ is the set of N modeled photoresist response values of measured response data at the optical image parameters $\vec{p}(i)$ computed at point i of interest. The weighting coefficients, $w_n(i)$, can be found as the squared reciprocal of the Euclidean distance $d_n(i)$ from the image point of interest i to each of the N measured (calibration and/or verification) data points:

$$w_n(i) = \frac{1}{d_n^2(i)} \qquad (5)$$

For example, in the photoresist model of Equation (1) where two image parameters, I_max and slope, are used, the Euclidean distance, $d_n(i)$, can be specified as:

$$d_n(i) = \sqrt{\begin{array}{l}(I_{max}(i) - I_{max}(n)) * (I_{max}(i) - I_{max}(n)) + \\ (slope(i) - slope(n)) * (slope(i) - slope(n))\end{array}} \qquad (6)$$

The photoresist response, R (see Equation 1), is a function of the M image parameters $p_j$ and has partial derivatives with respect to each of the image parameters, given by $\partial R/\partial p_j$, that are used to derive a metric of the sensitivity of the change in resist response function R to a change in a given image parameter $p_j$. This functional dependence can be used to compute the expected on-wafer response $r_n$ at the calibration or empirical point of interest:

$$r_n(i) = R\Big|_n + \sum_{j=1}^{M} \left(\left(\frac{\partial R}{\partial p_j}\right)\Big|_n * (p_j|_n - p_j(i))\right) \qquad (7)$$

where the functional relationships are evaluated using the image parameters computed at each of the data points, i, where the terms $R|_n$, $(\partial R/\partial p_j)|_n$, and $p_j|_n$ are determined by using image parameters computed from the optical model at the calibration points n. The UC(i) of the resist response at a point of interest i is preferably computed as an RMS error of the possible photoresist response values $r_i$ relative to the average resist response $\bar{r}_i$ using modified expected photoresist response values, e:

$$e_{2*n-1} = r_n - s_n$$

$$e_{2*n} = r_n + s_n \qquad (8)$$

where the modified resist response values e include errors, $s_n$, found at each of the measured data points n, where:

$$s_n = \sqrt{MFE_n^2 + \sigma_n^2} \qquad (9)$$

A model error value $MFE_n$ can be computed for every data (calibration and verification) point n by computing the modeled response $R|_n$ at point n and comparing it to the measured value at point n. Likewise, each data point n will have measurement uncertainty $\sigma_n$ associated with it. This empirically determined uncertainty associated with the measured data $\sigma_n$, may be due to errors in the meteorology system or variations in the process used to create each measurement point.

It is apparent that approximations and simplifications can be made to many of the Equations (3)-(9). Since the weighting terms, $w_n$, may become extremely small for data points far from the image points of interest, these points can often be neglected and the summations reduced to a relatively small set of data points with minimal loss of accuracy.

Figure 7:
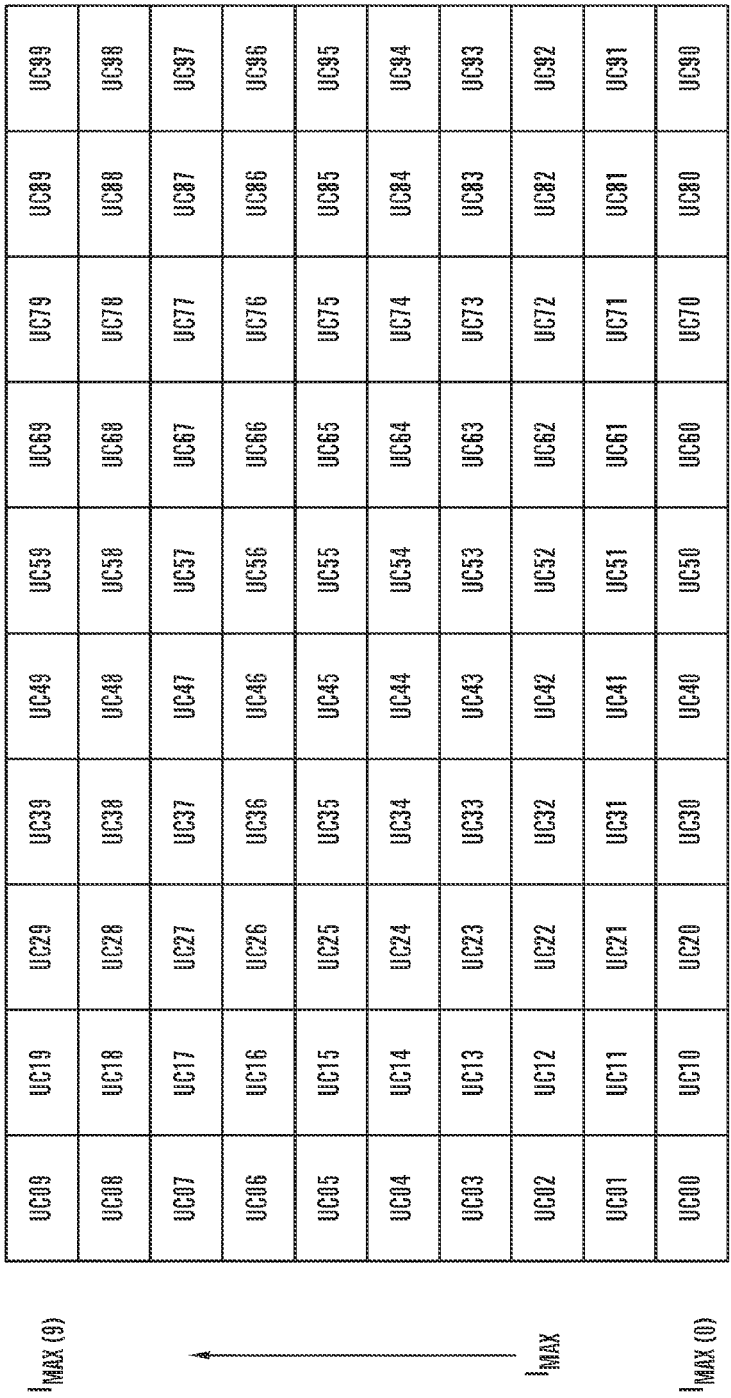
FIG. 7 illustrates an embodiment of a lookup table including uncertainty values in accordance with the invention.

To facilitate the storage and rapid retrieval of the uncertainty value information (see Equation 3), a multi-dimensional lookup table or Uncertainty Matrix (UM) can be created. One embodiment according to the invention is to create a matrix UM with dimensionality equal to the number N of unique optical image parameters in the resist model form. For example, for the resist model form given by Equation 1, there are two unique optical image parameters, $I_{max}$ and slope. In accordance with the invention, a range of expected values of $I_{max}$ and slope are selected as indices in a lookup table and UC values are computed for each pair of the selected lookup values of $I_{max}$ and slope. In the example illustrated in FIG. 7, a set of 10 values have been chosen, and a two dimensional uncertainty matrix UM 70 would be created where $I_{max}$ varies for each row of the UM 70 and slope varies for each column of the UM 70. For example, the uncertainty value of the resist response where $I_{max}$ equals $I_{max}(2)$ and slope equals slope(4) is represented by entry UC42, which in turn is computed using Equation 3.

In one embodiment, the optical image parameter values may be used as an index into the UM matrix 70, by converting the image parameter values into integers. One example of how to convert the image parameter value, such as slope, into an integer index value s is given here:

$$s = \text{Int}\left[\frac{(S-1)*(slope - slope_{lb})}{(slope_{ub} - slope_{lb})}\right] \qquad (10)$$

where $slope_{lb}$ and $slope_{ub}$ are the lower and upper bounds of all of the slope values stored in the UM 70, S is the number of slope values in the matrix, e.g. 10 in this example, and s is the integer index into the slope dimension of the matrix 70. Typically $slope_{lb}$ and $slope_{ub}$ will be similar to the lower and upper bounds of all of the slope values used in the model calibration, but may also extend past those bounds to account for the increase in uncertainty as the slope value moves further outside these limits. The indices then take on the integer values 0 to (S-1) for any slope within the model bounds.

Once the dimensionality and index formulas have been determined, the UM can be populated with data from the model calibration. The uncertainty coefficients, i.e. $UC(\vec{p}(k))$ are computed using Equation 3, and are associated with an expected response R(k), where k represents a particular set of image parameter values $\vec{p}(k)$ used in creating the UM table and entered into the matrix at the locations determined by their image parameters. In the example where the image parameters of interest are slope and I_max, the uncertainty coefficients are specified as $UC_{sx}$ where s is the slope index as given by Equation 10 and x is the $I_{max}$ index given by a similar equation for the $I_{max}$ parameter.

Another embodiment according to the invention, one method of determining the appropriate image parameter values is to use the average values for each parameter for the uncertainty value of interest. For example, to find the average slope value for $UC_{sx}$, Equation 10 can be inverted to give:

$$slope = slope_{lb} + s * \left[\frac{(slope_{ub} - slope_{lb})}{(S)}\right] \qquad (11)$$

It is understood that instead of using a multi-dimensional matrix, a single-dimensional array could also be used where the indexing into the array is based on all image parameter values. This could provide speed advantages in accessing the data. Other more efficient storage and retrieval algorithms could also be employed.

Figure 8:
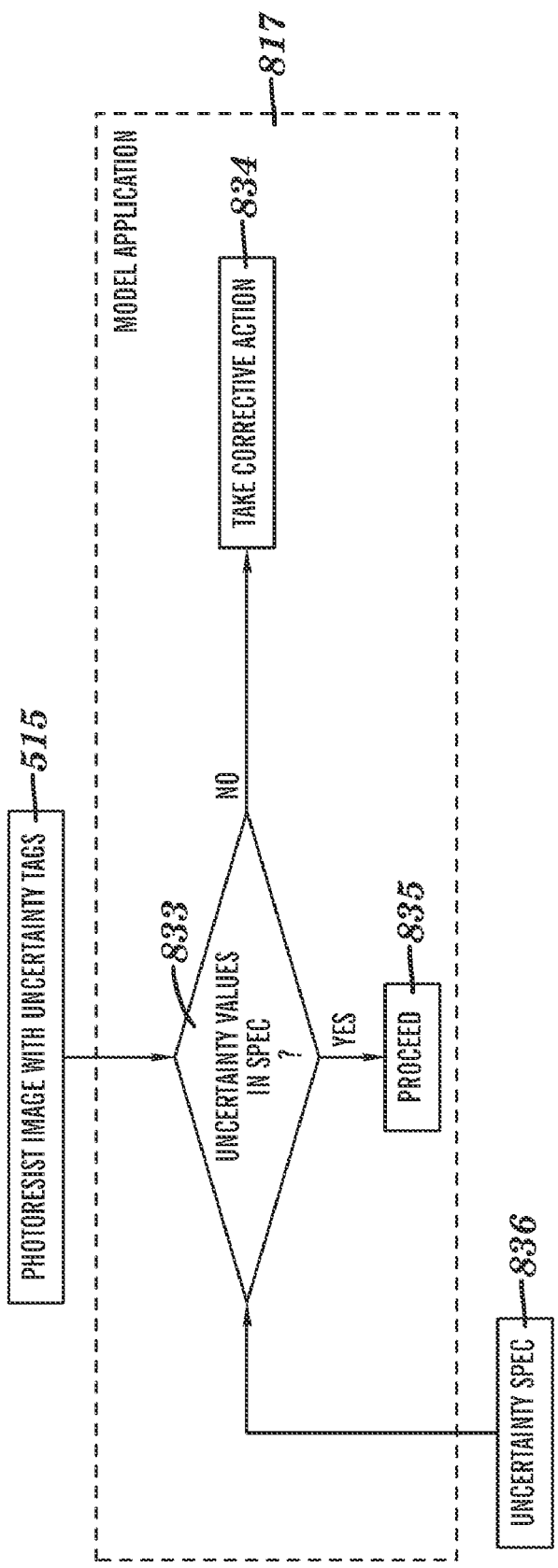
FIG. 8 illustrates yet another embodiment of performing mask design in accordance with the invention.

Once populated, the UM can be saved with the photoresist model and used to determine the uncertainty in the model response to an arbitrary image point. The uncertainty value for the arbitrary image point can be looked up in the UM, by finding indices in a manner similar to Equation 10, and then be compared to a pre-determined cut-off value or a series of pre-determined cut-off values, as shown in FIG. 8. In this case, the photoresist image with uncertainty tags 515, as in FIG. 5, is analyzed (Block 817). Either individually or collectively, the tags are compared 833 to an uncertainty criterion or spec 836. If the tag(s) are found to be out of spec, then corrective action is taken 834. If the tag(s) are in spec, then the program flow proceeds as normal (Block 835). In this way, simulations with low uncertainty values are treated as trustworthy and accurate, while those with high uncertainty values are highlighted for further scrutiny. If the application is an optical proximity correction, for example, the modeled response for trustworthy regions may be used to determine how to properly manipulate the design to account for the proximity error. A response that violates the uncertainty criterion, on the other hand, could result in taking an action such as requiring the associated computed edge fragment to be frozen and not allow the OPC engine to move the edge or to mark the edge with a flag that would initiate manual intervention.

The cut-off or uncertainty criterion spec 836 can be determined empirically or by analyzing the uncertainty values for the calibration and/or verification data. A typical uncertainty spec is in the range of 1-10% of the size of the minimum feature in the design being analyzed, although values outside this range could also be used. Typically, the cut-off value(s) should be consistent with the worst case uncertainty coefficient; although, depending on the level of risk that the user is willing to assume, the cut-offs can be set above the worst case uncertainty coefficient. A series of cut-off values can be used for various purposes, including to quantify levels of risk and to allow varying levels of risk for varying pattern types. To quantify levels of risk, the flags for untrustworthy responses can be assigned a value that correlates to the level of risk. Different actions can be taken depending on the level of risk. Likewise, if different pattern types can tolerate different levels of risk, a series of rules-based checks of the untrustworthy response can be used to classify the geometry and apply the appropriate cut-off value for the particular pattern type classification. For example, the most critical geometries in a particular design may require a tight uncertainty spec of 1% of the minimum feature size, while more error can be tolerated on non-critical geometries which may function acceptably with an uncertainty spec of 10% of the minimum feature.

Figure 9:
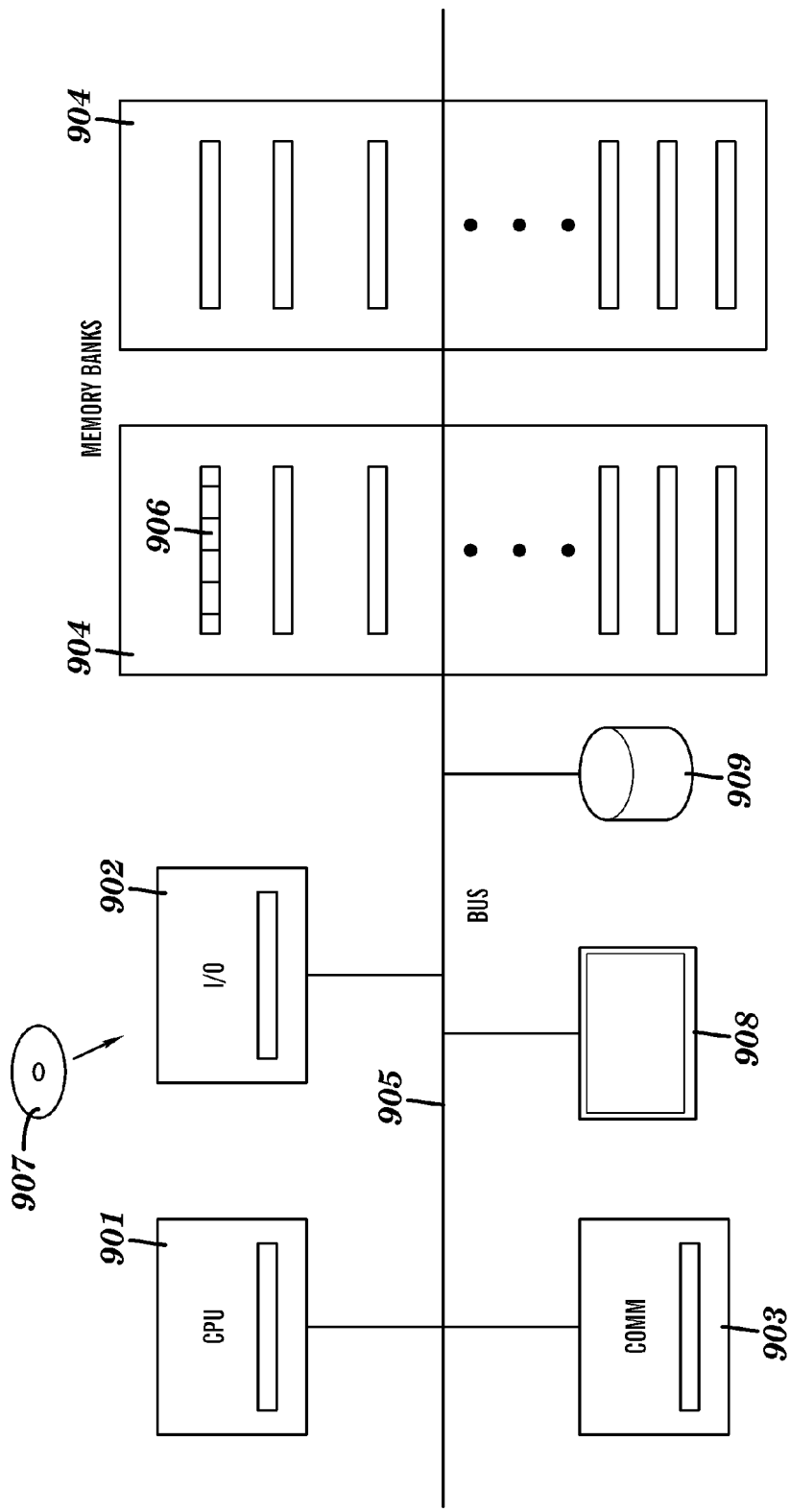
FIG. 9 illustrates an embodiment of a computer program product and computer system for performing the method in accordance with the invention.

The present invention is ultimately to be implemented in a digital computer, as shown on FIG. 9, which main components are: a central processing unit (CPU) 901, at least one input/output (I/O) device 902 (such as a keyboard, a mouse, a compact disk (CD) drive, and the like), a controller 903, a display device 908, a storage device 909 capable of reading and/or writing computer readable code, and one or more memory banks 904 which may contain multiple memory devices 906—all of which are connected, e.g., by a bus or a communications network (905). The present invention can be implemented as a computer program product stored on a computer readable medium 907, such as a tape or CD. The computer program product contains instructions to implement the method according to the present invention on a digital computer, as shown in FIG. 9. Finally, the present invention can also be implemented in a plurality of such a digital computer where the present items may reside in close physical proximity or distributed over a large geographic region and connected by a communications network.

While the present invention has been particularly described, in conjunction with a specific preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present invention.

The invention claimed is:

1. A method for optimizing a lithographic process for manufacturing semiconductor integrated circuits, the lithographic process including using an empirically calibrated process model, the method comprising:
   providing a calibration test structure;
   computing an optical image for said calibration test structure using an optical model;
   forming a printed image of said calibration test structure on a wafer using the lithographic process;
   determining measurement data from said printed calibration test structure and optical image parameters from said optical image at selected calibration points of said calibration test structure;
   providing a process model for determining a predicted on-wafer response value, said process model comprising a function of optical image parameters;
   calibrating said process model so that said predicted on-wafer response value predicts said measurement data within a predetermined metric;
   providing an uncertainty metric associated with said predicted on-wafer response value for a selected set of values of said optical image parameters, said uncertainty metric comprising a function of a distance metric between said selected set of values of said optical image parameters and said optical image parameters at said selected calibration points;
   applying said process model to a non-calibration mask pattern to obtain a predicted non-calibration on-wafer response; and
   determining whether said uncertainty metric associated with said predicted non-calibration on-wafer response violates a predetermined criterion.

2. The method according to claim 1, wherein if said predetermined criterion is violated, then modifying said non-calibration mask pattern in accordance with said predetermined criterion.

3. The method according to claim 1, wherein at least one of said optical image parameters are selected from the group consisting of maximum intensity, minimum intensity, image slope, image curvature, and integrated intensity.

4. The method of claim 1, wherein said distance metric comprises a Euclidean distance between said optical image parameters obtain from said optical model at an evaluation point of interest and said optical image parameters from said optical image at said selected calibration points.

5. The method of claim 1, wherein said uncertainty metric further comprises a function of a sensitivity metric that represents a rate of change of said predicted on-wafer response value as a function of a change in said optical image parameters along said distance metric.

6. The method of claim 5, wherein said sensitivity metric comprises taking a partial derivative of said process model as a function of one of said optical image parameters.

7. The method of claim 1, wherein said lithographic process is selected from the group consisting of a resist process and an etch process.

8. The method of claim 1, wherein said uncertainty metric comprises determining a root-mean-square of said distance metric between said selected set of optical image parameters evaluated at an evaluation point of interest and said optical image parameters at said selected calibration points.

9. The method of claim 1, further comprising determining a set of uncertainty values of said uncertainty metric over a range of selected values of said optical image parameters, and storing said set of uncertainty values in a look-up table.

10. The method of claim 1, wherein said uncertainty metric further comprises a function of uncertainty in said measurement data.

11. A computer program product comprising computer readable storage medium having stored therein computer readable instructions which when executed by a computer cause the computer to perform method steps for optimizing a lithographic process for manufacturing semiconductor integrated circuits, the lithographic process including using an empirically calibrated process model, the method comprising:
   providing a calibration test structure;
   computing an optical image for said calibration test structure using an optical model;
   forming a printed image of said calibration test structure on a wafer using the lithographic process;
   determining measurement data from said printed calibration test structure and optical image parameters from said optical image at selected calibration points of said calibration test structure;
   providing a process model for determining a predicted on-wafer response value, said process model comprising a function of optical image parameters;
   calibrating said process model so that said predicted on-wafer response value predicts said measurement data within a predetermined metric;
   providing an uncertainty metric associated with said predicted on-wafer response value for a selected set of values of said optical image parameters, said uncertainty metric comprising a function of a distance metric between said selected set of values of said optical image parameters and said optical image parameters at said selected calibration points;

applying said process model to a non-calibration mask pattern to obtain a predicted non-calibration on-wafer response; and determining whether said uncertainty metric associated with said predicted non-calibration on-wafer response violates a predetermined criterion.

12. The computer program product according to claim 11, wherein if said predetermined criterion is violated, then said method further comprising modifying said non-calibration mask pattern in accordance with said predetermined criterion.

13. The computer program product according to claim 11, wherein at least one of said optical image parameters are selected from the group consisting of maximum intensity, minimum intensity, image slope, image curvature, and integrated intensity.

14. The computer program product of claim 11, wherein said distance metric comprises a Euclidean distance between said optical image parameters obtain from said optical model at an evaluation point of interest and said optical image parameters from said optical image at said selected calibration points.

15. The computer program product of claim 11, wherein said uncertainty metric further comprises a function of a sensitivity metric that represents a rate of change of said predicted on-wafer response value as a function of a change in said optical image parameters along said distance metric.

16. The computer program product of claim 15, wherein said sensitivity metric comprises taking a partial derivative of said process model as a function of one of said optical image parameters.

17. The computer program product of claim 11, wherein said lithographic process is selected from the group consisting of a resist process and an etch process.

18. The computer program product of claim 11, wherein said uncertainty metric comprises determining a root-mean-square of said distance metric between said selected set of optical image parameters evaluated at an evaluation point of interest and said optical image parameters at said selected calibration points.

19. The computer program product of claim 11, further comprising determining a set of uncertainty values of said uncertainty metric over a range of selected values of said optical image parameters, and storing said set of uncertainty values in a look-up table.

20. The computer program product of claim 11, wherein said uncertainty metric further comprises a function of uncertainty in said measurement data.

* * * * *